(12) United States Patent
How et al.

(10) Patent No.: US 7,749,809 B2
(45) Date of Patent: Jul. 6, 2010

(54) METHODS AND SYSTEMS FOR PACKAGING INTEGRATED CIRCUITS

(75) Inventors: You Chye How, Melaka (MY); Shee Min Yeong, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 174 days.

(21) Appl. No.: 11/958,288

(22) Filed: Dec. 17, 2007

(65) Prior Publication Data

US 2009/0152707 A1 Jun. 18, 2009

(51) Int. Cl.
*H01L 21/00* (2006.01)
(52) U.S. Cl. ............... 438/110; 438/127; 438/458; 438/612; 438/622; 257/E23.006
(58) Field of Classification Search ........... 438/110, 438/127, 458, 612, 622; 257/E23.006
See application file for complete search history.

(56) References Cited

U.S. PATENT DOCUMENTS

| | | | |
|---|---|---|---|
| 3,772,064 A | 11/1973 | Mendelson et al. | |
| 4,442,137 A | 4/1984 | Kumar | |
| 5,206,181 A | 4/1993 | Gross | |
| 5,316,853 A | 5/1994 | Shibata et al. | |
| 5,356,949 A | 10/1994 | Komiyama et al. | |
| 5,597,767 A | 1/1997 | Mignardi et al. | |
| 5,827,394 A | 10/1998 | Lu | |
| 5,923,995 A | 7/1999 | Kao et al. | |
| 5,960,260 A | 9/1999 | Umehara et al. | |
| 5,969,426 A | 10/1999 | Baba et al. | |
| 6,001,671 A * | 12/1999 | Fjelstad | 438/112 |
| 6,023,094 A | 2/2000 | Kao et al. | |
| 6,025,650 A * | 2/2000 | Tsuji et al. | 257/786 |
| 6,175,162 B1 | 1/2001 | Kao et al. | |
| 6,176,966 B1 | 1/2001 | Tsujimoto et al. | |
| 6,214,703 B1 | 4/2001 | Chen et al. | |
| 6,235,366 B1 | 5/2001 | Matsumoto et al. | |
| 6,319,754 B1 | 11/2001 | Wang et al. | |
| 6,383,833 B1 | 5/2002 | Silverbrook | |

(Continued)

FOREIGN PATENT DOCUMENTS

JP 54-131537 10/1979

(Continued)

OTHER PUBLICATIONS

U.S. Appl. No. 11/484,144, filed Jul. 10, 2006.

(Continued)

*Primary Examiner*—David A Zarneke
*Assistant Examiner*—Jenny L Wagner
(74) *Attorney, Agent, or Firm*—Beyer Law Group LLP

(57) ABSTRACT

Panel level methods and systems for packaging integrated circuits are described. In a method aspect of the invention, a substrate formed from a sacrificial semiconductor wafer is provided having a plurality of metallized device areas patterned thereon. Each device area includes an array of metallized contacts. Dice are mounted onto each device area and electrically connected to the array of contacts. The surface of the substrate including the dice, contacts and electrical connections is then encapsulated. The semiconductor wafer is then sacrificed leaving portions of the contacts exposed allowing the contacts to be used as external contacts in an IC package. In various embodiments, other structures, including saw street structures, may be incorporated into the device areas as desired. By way of example, structures having thicknesses in the range of 10 to 20 microns are readily attainable.

14 Claims, 7 Drawing Sheets

U.S. PATENT DOCUMENTS

| | | | |
|---|---|---|---|
| 6,398,892 B1 | 6/2002 | Noguchi et al. | |
| 6,444,310 B1 | 9/2002 | Senoo et al. | |
| 6,610,167 B1 | 8/2003 | Glenn et al. | |
| 6,623,594 B1 | 9/2003 | Yamamoto et al. | |
| 6,702,910 B2 | 3/2004 | Noguchi et al. | |
| 6,709,953 B2 | 3/2004 | Vasquez et al. | |
| 6,797,541 B2 | 9/2004 | Chun et al. | |
| 6,812,552 B2 | 11/2004 | Islam et al. | |
| 6,858,919 B2 | 2/2005 | Seo et al. | |
| 6,873,032 B1 | 3/2005 | McCann et al. | |
| 6,873,059 B2 | 3/2005 | Amagai et al. | |
| 6,943,434 B2 | 9/2005 | Tangpuz et al. | |
| 6,953,988 B2 | 10/2005 | Seo et al. | |
| 6,967,125 B2 | 11/2005 | Fee et al. | |
| 7,009,286 B1 * | 3/2006 | Kirloskar et al. | 257/684 |
| 7,095,096 B1 | 8/2006 | Mostafazadeh | |
| 7,160,755 B2 | 1/2007 | Lo et al. | |
| 7,244,664 B2 | 7/2007 | Blair et al. | |
| 7,268,012 B2 | 9/2007 | Jiang et al. | |
| 7,294,911 B2 | 11/2007 | Lee et al. | |
| 7,507,603 B1 * | 3/2009 | Berry et al. | 438/113 |
| 2003/0143819 A1 | 7/2003 | Hedler et al. | |
| 2004/0058478 A1 | 3/2004 | Islam et al. | |
| 2004/0104491 A1 | 6/2004 | Connell et al. | |
| 2004/0106233 A1 | 6/2004 | Lin et al. | |
| 2004/0161876 A1 | 8/2004 | Tandy et al. | |
| 2004/0191510 A1 | 9/2004 | Kiuchi et al. | |
| 2005/0070095 A1 | 3/2005 | Sharan et al. | |

OTHER PUBLICATIONS

U.S. Appl. No. 11/691,428, filed Mar. 26, 2007.
Office Action dated May 28, 2009 in U.S. Appl. No. 11/484,144.

* cited by examiner

METHODS AND SYSTEMS FOR PACKAGING INTEGRATED CIRCUITS

FIELD OF THE INVENTION

The present invention relates generally to the packaging of integrated circuit (IC) devices. More particularly, the invention relates to panel level arrangements and methods for packaging integrated circuit dice using a wafer as a substrate panel.

BACKGROUND

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections. In general, the die and portions of the leadframe are encapsulated with a molding material to protect the delicate electrical components on the active side of the die while leaving selected portions of the leadframe exposed to facilitate electrical connection to external devices.

Although existing techniques for fabricating leadframes and for packaging integrated circuits using leadframe technology work well, there are continuing efforts to develop even more efficient designs and methods for packaging integrated circuits.

SUMMARY

To achieve the foregoing and other objects of the invention, improved arrangements and processes for packaging integrated circuits are described. In particular, panel level methods and systems for packaging integrated circuits are described.

In one aspect a method of constructing a panel suitable for use in the packaging of integrated circuit dice is described. The first surface of a sacrificial semiconductor substrate is metallized to form first portions of an array of metallized electrically isolated contacts that are not electrically connected to any circuits within the wafer. Thereafter, the first surface of the substrate is covered with a molding material while leaving first surfaces of the contacts substantially exposed and uncovered by molding material. The method further includes metallizing the substrate to form second portions of the array of contacts after encapsulating the first surface of the substrate and the first portions of the contacts. Each second portion of a contact is positioned over the first surface of an associated first portion of a contact and physically and electrically connected with the associated first portion of the contact. At least some of the second portions of the contacts each include an associated bonding portion that is not positioned directly over the first portion of the contact and an associated trace portion that electrically connects the bonding portion with the portion of the contact directly over the associated first portion of the contact such that the bonding portion and the trace portion of each contact are positioned over the molding material used to encapsulate the first surface of the substrate In various embodiments, the method additionally includes forming metallized saw street structures during the first metallization that are arranged into associated saw streets that define the plurality of device areas prior to encapsulating the first surface of the substrate. Some of the metallized saw streets have associated gaps at least between ones of the saw street structures. The gaps are arranged such that each device area includes at least one associated saw street having at least one gap in the portion of the saw street adjacent the device area such that during encapsulation of the saw street structures the gaps allow molding material to flow therethrough.

In various embodiments, the method further includes attaching a plurality of dice to the substrate, wherein each die is mounted on an associated device area. The method also includes electrically connecting the dice to selected second portions of the contacts on their associated device areas with electrical connections and encapsulating the dice, the second portions of the contacts and the electrical connections with molding material. The method further includes sacrificing the semiconductor material of the wafer after the encapsulation leaving at least portions of the contacts exposed to serve as electrical contacts for their associated dice.

In another aspect, a panel suitable for use in the packaging of integrated circuit dice is described. The panel includes a substrate formed from a sacrificial semiconductor wafer. A multiplicity of metallized electrically isolated contacts that are not electrically connected to any circuits within the wafer are arranged such that each device area includes an array of the contacts, each contact having a first portion and a second portion. Each first portion of a contact is in contact with the first surface of the substrate and each second portion of a contact is positioned over the first surface of an associated first portion of a contact and physically and electrically connected with the associated first portion of the contact. Additionally, some of the second portions of the contacts each include an associated bonding portion that is not positioned directly over the first portion of the contact and an associated trace portion that electrically connects the bonding portion with the portion of the contact directly over the associated first portion of the contact. A molding material encapsulates portions of the first surface of the wafer, the first portions of the contacts and the second portions of the contacts while leaving outer surfaces of the second portions of the contacts including outer surfaces of the bonding portions exposed.

The advantages of such arrangements and methods are significant. Firstly, costs are potentially reduced since packaging may be performed on a greater scale on a panel level. Secondly, having thinner contacts and die attach pads leads to better thermal performance. Lastly, higher throughput is expected with such panel level arrangements and methods.

BRIEF DESCRIPTION OF THE DRAWINGS

The invention, together with further objects and advantages thereof, may best be understood by reference to the following description taken in conjunction with the accompanying drawings in which.

In the drawings, like reference numerals designate like structural elements. Also, it should be understood that the depictions in the FIG.s are not to scale.

DETAILED DESCRIPTION

The present invention relates generally to the packaging of integrated circuit (IC) devices. More particularly, the invention relates to panel level arrangements and methods for packaging integrated circuit dice using a wafer as a substrate panel.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring the present invention.

Figure 1:
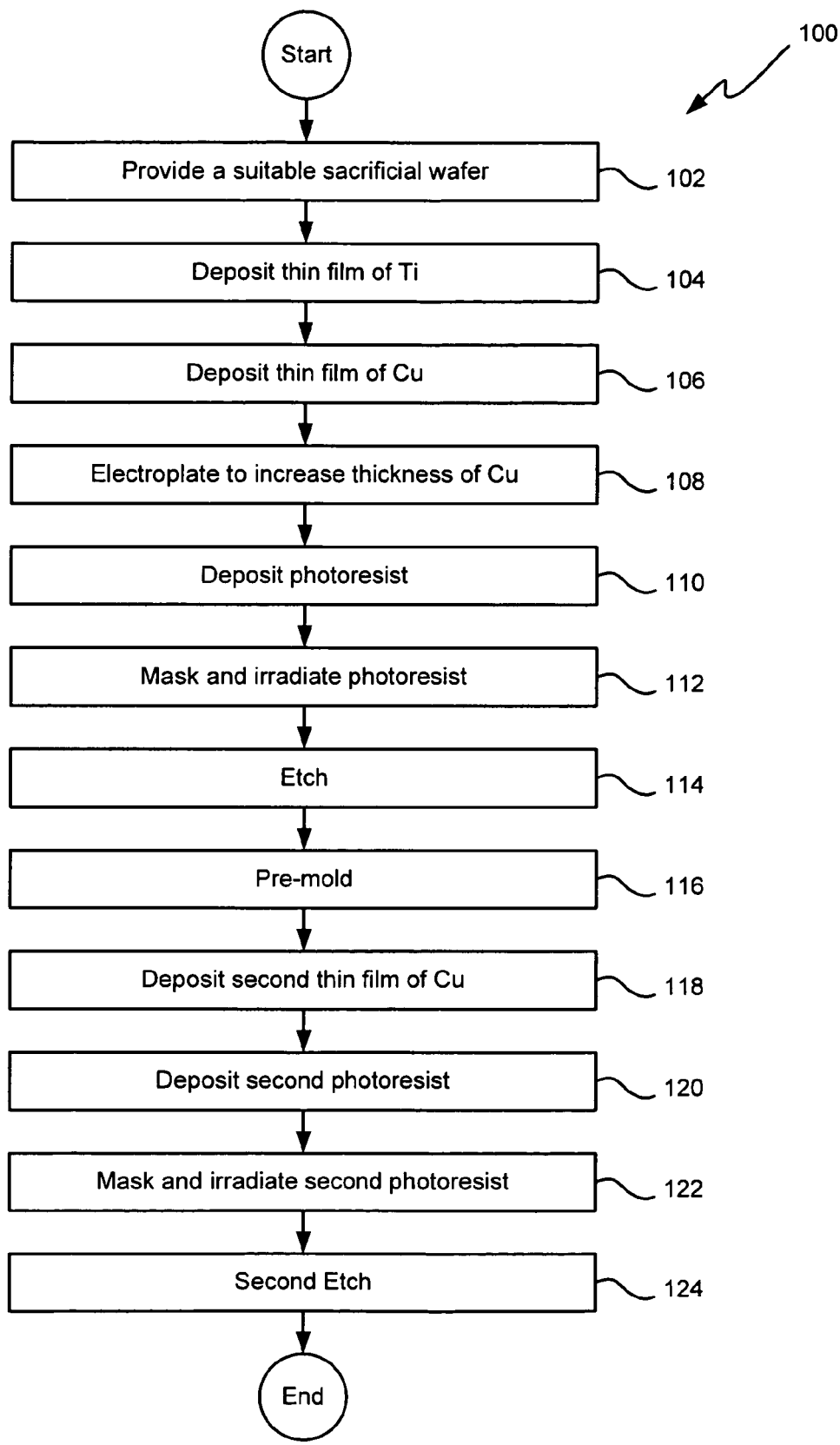
FIG. 1 shows a flowchart illustrating a process of constructing a metallized sacrificial wafer substrate suitable for use in the packaging of integrated circuits in accordance with one embodiment of the present invention.
Figure 2A:
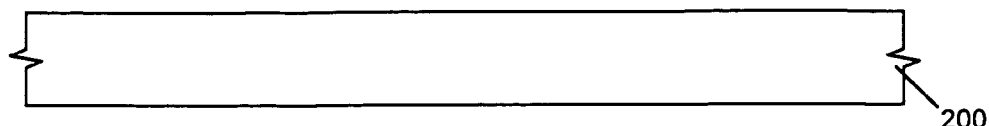
FIGS. 2A-Q illustrate diagrammatic cross sections of a semiconductor wafer suitable for use as a sacrificial wafer substrate in the packaging of integrated circuit dice in accordance with various embodiments of the present invention.
Figure 2B:
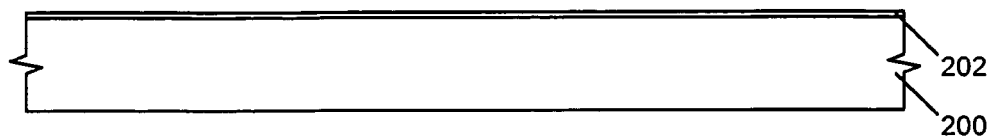

Referring initially to FIG. 1, and further in view of FIGS. 2A-J, a process 100 of constructing a sacrificial wafer substrate suitable for use in the packaging of integrated circuits in accordance with one embodiment of the present invention will be described. Initially, in step 102, a suitable sacrificial wafer 200 is provided. In a preferred embodiment, the wafer is a semiconductor wafer formed from a semiconductor material such as silicon. In order to prepare the wafer for use as a substrate, the wafer is first metallized. A wide variety of metallization techniques can be used to metallize the wafer. In the initially described embodiments, a thin film of titanium 202 is initially deposited at 104 onto the front (top) surface of the sacrificial wafer 200 as is illustrated in FIG. 2B. Next, a thin film of copper 204 is deposited onto the thin film of titanium 202 in step 106. It should be noted that a copper alloy or other suitable conducting material may be used in place of the copper.

The titanium film 202 is sufficiently thick to serve as a barrier against copper migration. As is well known in the art, titanium films are often employed as barriers against copper poisoning, whereby copper migrates into a semiconductor wafer. In the described embodiment, the thin metallic films are deposited by sputtering, although other methods may be used, such as thermal evaporation, electroplating, or any other suitable method or combination of methods may be used by which a thin uniform metallic film is deposited with an accurately controlled thickness.

Figure 2C:
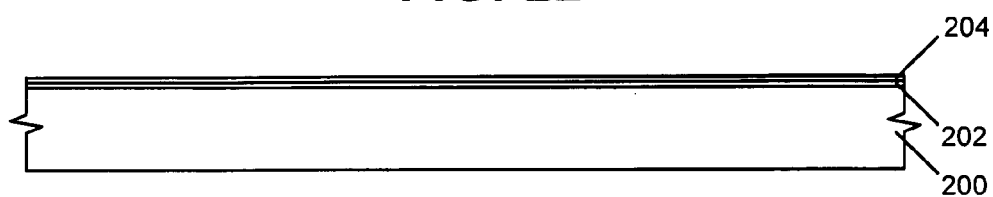

FIG. 2C shows the sacrificial wafer 200 with the copper film 204 deposited onto the titanium film 202. In step 108, the copper film 204 is electroplated to further grow the copper film to a desired thickness. It should be noted that the electroplating is not necessary if the copper film 204 that is originally deposited is already of the desired thickness. The copper film is generally grown to a thickness in the range of approximately 10 to 20 microns. However, both thicker and thinner films are readily attainable and may be used to meet the needs of any particular package.

Figure 2D:
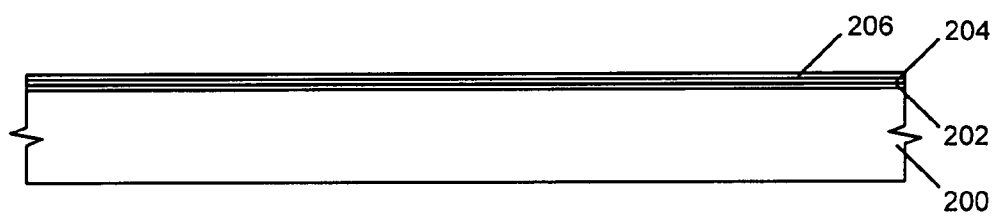
Figure 2E:
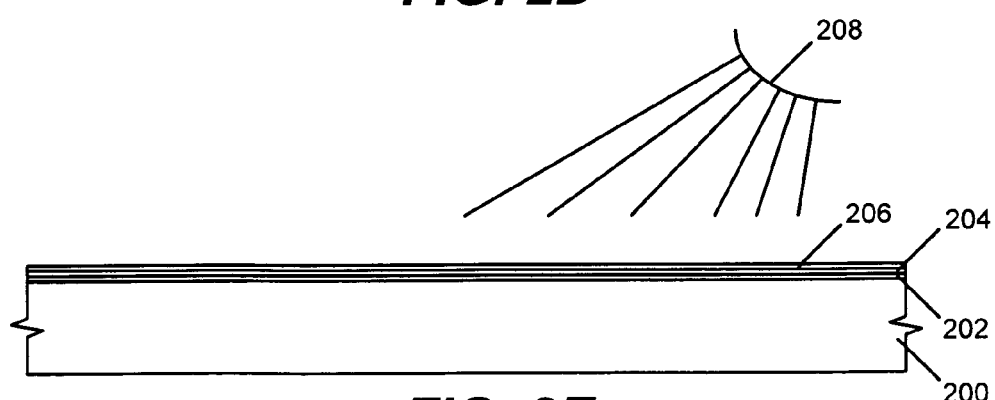
Figure 2F:
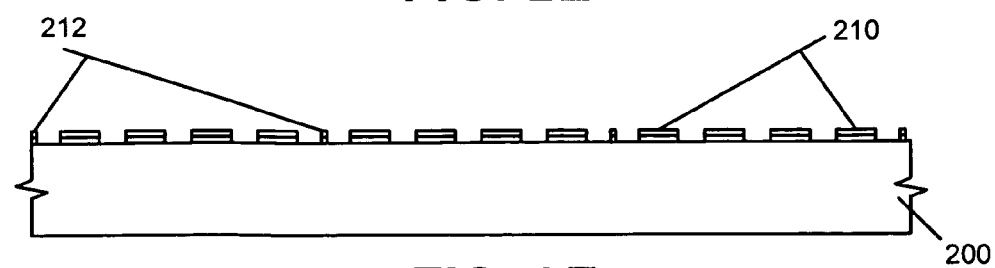
Figure 2G:
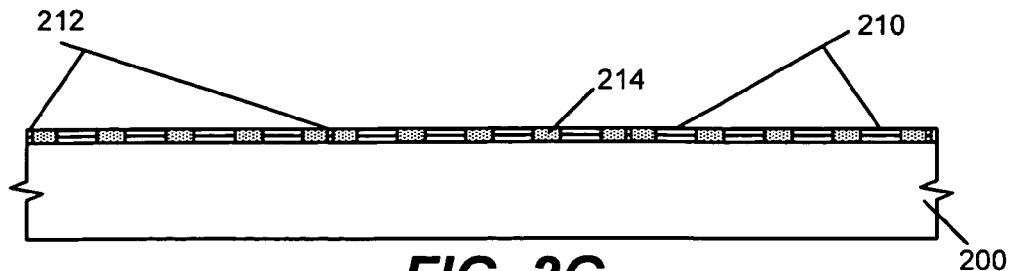
Figure 3B:
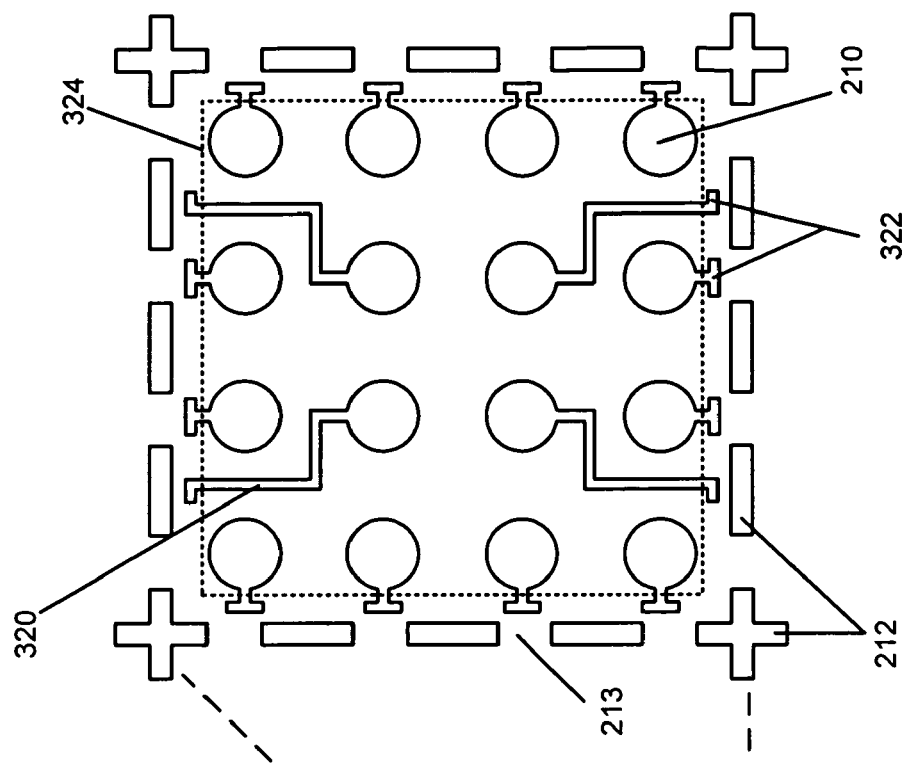
FIG. 3B illustrates a magnified view of one device area of FIG. 3A in accordance with one embodiment of the present invention.
Figure 3A:
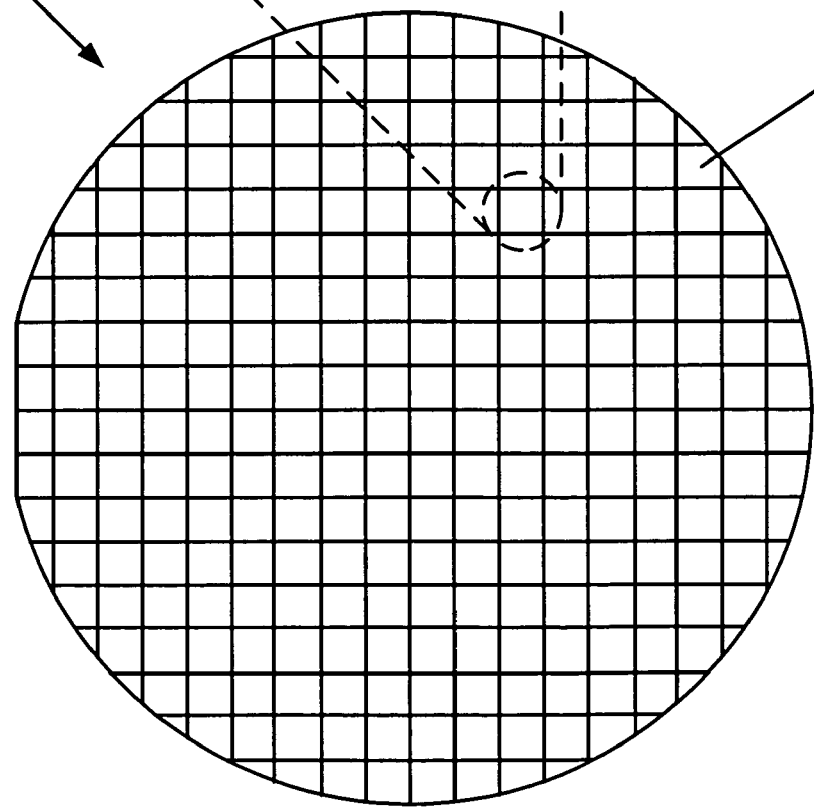
FIG. 3A illustrates the top (front) surface of a metallized sacrificial wafer substrate having a plurality of metallized device areas patterned thereon in accordance with one embodiment of the present invention.

After the metallization has been applied to the wafer, it is patterned to define a multiplicity of device areas 302 suitable for use in the packaging of integrated circuits, as is illustrated in FIG. 3B, which illustrates a top view of a single device area 302 from the resultant substrate 300. A wide variety of conventional patterning techniques can be used to pattern the wafer appropriately. By way of example, in the described embodiment, a photoresist 206 is subsequently deposited onto the copper film 204 in step 110. FIG. 2D illustrates the photoresist 206 deposited on top of the copper film 204. The photoresist 206 may be a positive photoresist, whereby the portion of the photoresist that is exposed to light becomes soluble to a photoresist developer, or a negative photoresist, whereby the portion of the photoresist that is unexposed to light is soluble and is dissolved by a photoresist developer. In step 112, the photoresist 206 is masked according to a desired pattern and irradiated with a light source 208, as is illustrated in FIG. 2E.

In step 114, the photoresist 206 is then exposed to the photoresist developer and the metallic films 202 and 204 are etched. It should be noted that other suitable means of patterning and etching may be used as well. The etched pattern defines a plurality of device areas 302 suitable for use in the packaging of integrated circuits. In the embodiment illustrated in FIGS. 2F and 3B, the metallic films 202 and 204 are patterned and etched such that each device area 302 includes first portions of an array of contacts 210 and sacrificial saw street structures 212. The metallized sacrificial saw streets structures 212 are arranged into associated saw streets and are called as such because they may serve as marker lines indicating where the device areas 302 are to be sawed or singulated.

At step 116, the top surface of the substrate, the first portions of the contacts 210 and the sacrificial saw street structures 212 are encapsulated with a molding material (compound) 214. The molding compound is generally a non-conductive plastic or resin having a low coefficient of thermal expansion. In a preferred embodiment, the entire populated substrate is encapsulated substantially simultaneously. By way of example, the substrate may be encapsulated with a film assisted molding (FAM) system. In the embodiment illustrated in FIG. 2G, the substrate is encapsulated such that the molding compound 214 is prevented from intruding over or covering the first portions of the contacts 210 and the saw street structures 212. This may be accomplished in various embodiments by pressing the top surfaces of the contacts 210 and saw street structures 212 to the surface of a mold cavity used in encapsulating the substrate with molding compound 214. In an FAM system, a film is positioned between the mold cavity and any portions that would contact the mold cavity. The film aids in protecting the delicate structures on the substrate. Gaps 213 between the saw street structures 212 permit molding material to flow into each device area 302 as illustrated in FIG. 3B. In this way, the top surfaces of the contacts 210 and saw street structures 212 are left exposed after encapsulation while leaving the molding material coplanar with the top surfaces of the exposed contacts and saw street structures. The lengths of the saw street structures 212 and associated gaps 213 may be widely varied.

Figure 2H:
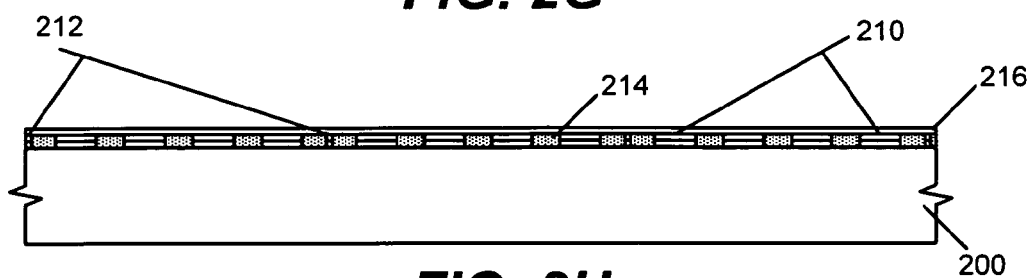
Figure 2I:
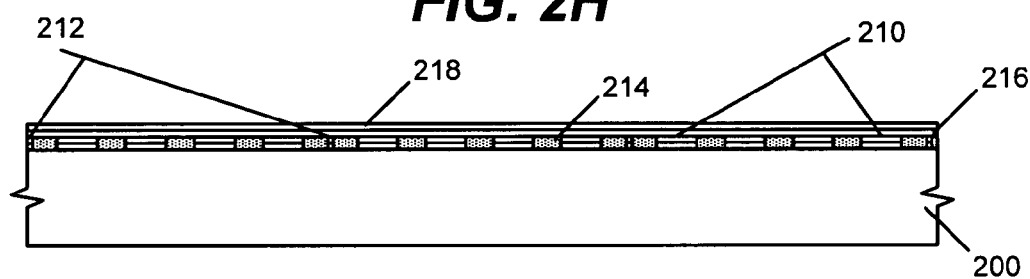
Figure 2J:
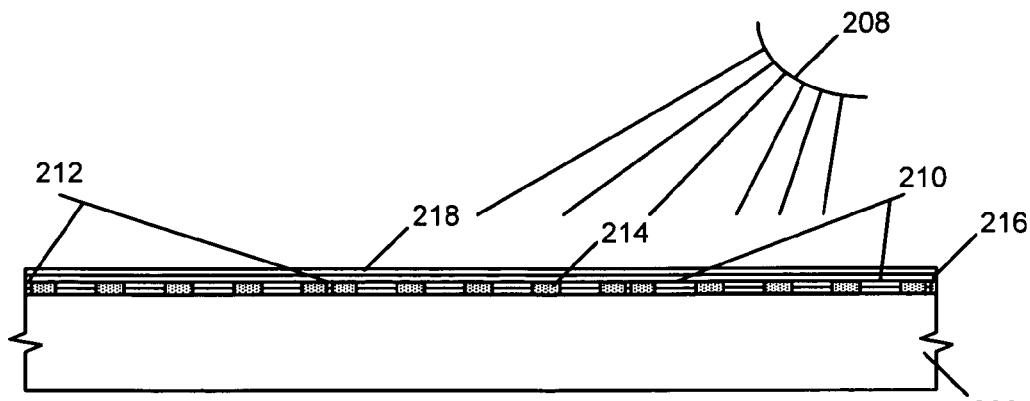

Next, at 118 a second thin film 216 formed of copper or another suitable conductive material is deposited over the molding material 214, the first portions of the contacts 210 and the saw street structures 212. Again, any suitable method, such as those described above, may be used to deposit the second thin film 216. As can be seen in FIG. 2H, the second film 216 is in direct contact with the first portions of the contacts 210 and the saw streets 212. After the second film 216 of metallization has been applied to the wafer, it is then patterned to define second portions of the contacts 210. Again, a wide variety of conventional patterning techniques can be used to pattern the wafer appropriately. By way of example, in the described embodiment, a photoresist 218 is subsequently deposited onto the copper film 216 in step 120 as illustrated in FIG. 2I. In step 122, the photoresist 218 is masked according to the desired pattern and irradiated with a light source 208, as is illustrated in FIG. 2J. In step 124, the photoresist 218 is then exposed to a photoresist developer and the metallic film 216 is etched to define the second portions of the contacts 210. Once more, it should be noted that other suitable means of patterning and etching may be used as well.

Figure 2K:
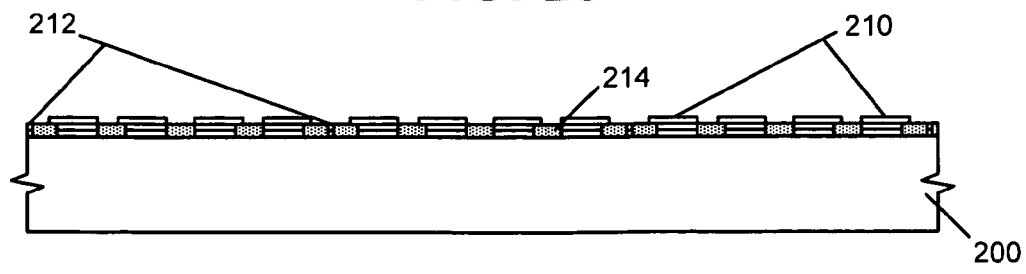

In the embodiment illustrated in FIG. 2K, the second portions of the contacts 210 are formed/patterned directly over the first portions of the contacts. As such, the second portions of the contacts 210 are in direct physical and electrical contact with the first portions of the contacts, respectively. Additionally, in the illustrated embodiment it can be seen that the second portions of the contacts 210 extend beyond the first portions of the contacts and over the molding material 214. Thus, the molding material 214 actually supports the extended second portions of the contacts 210. In some embodiments, the second portions, in effect, serve as redistribution lines. The extended geometries of the second portions of the contacts 210 are illustrated in more detail in FIG. 3B. In FIG. 3B, each extended second portion forms a trace 320 that extends to a corresponding bonding portion 322 at the periphery of a die attach area 324 (illustrated with a dotted line) of each device area 302. In various embodiments, at least some traces 320 extend between other contacts 210. In this way, a package resembling a microarray package may be formed.

It should be appreciated that the underlying sacrificial wafer eliminates the need for the use of tie bars and/or other structures to support the contacts 210 and various other features as is required in conventional leadframes. Eliminating the tie bars and various other supporting structures potentially permits the device areas to be packed more tightly as well as allowing for thinner packages. By way of example, based on a 2×2 mm package size, approximately 750 such packages may be formed from a standard leadframe strip whereas approximately 3750 units may be formed from a 6 in diameter wafer and approximately 6700 units may be formed from an 8 in diameter wafer.

The metallized contacts 210 illustrated in FIGS. 2K and 3B are arranged in a grid array having an inner row and an outer row (in the context of this discussion a "row" extends along all four sides of the device). Of course, the number of contacts 210 and the size of the grid array can be widely varied depending upon the needs of a particular application, and as will be appreciated by those familiar with the art, the grid array can include additional rows as well as additional metallized lead traces 320 coupled to contacts 210.

Figure 2L:
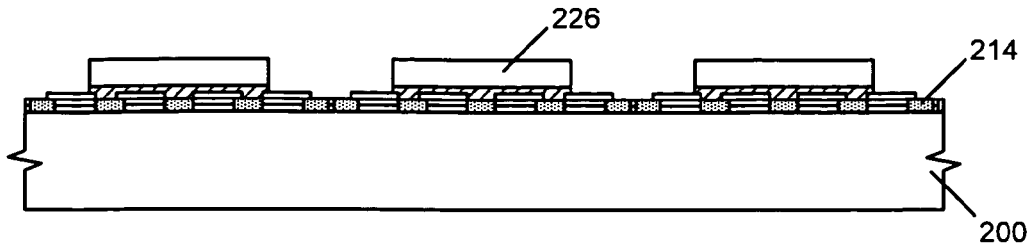
Figure 3C:
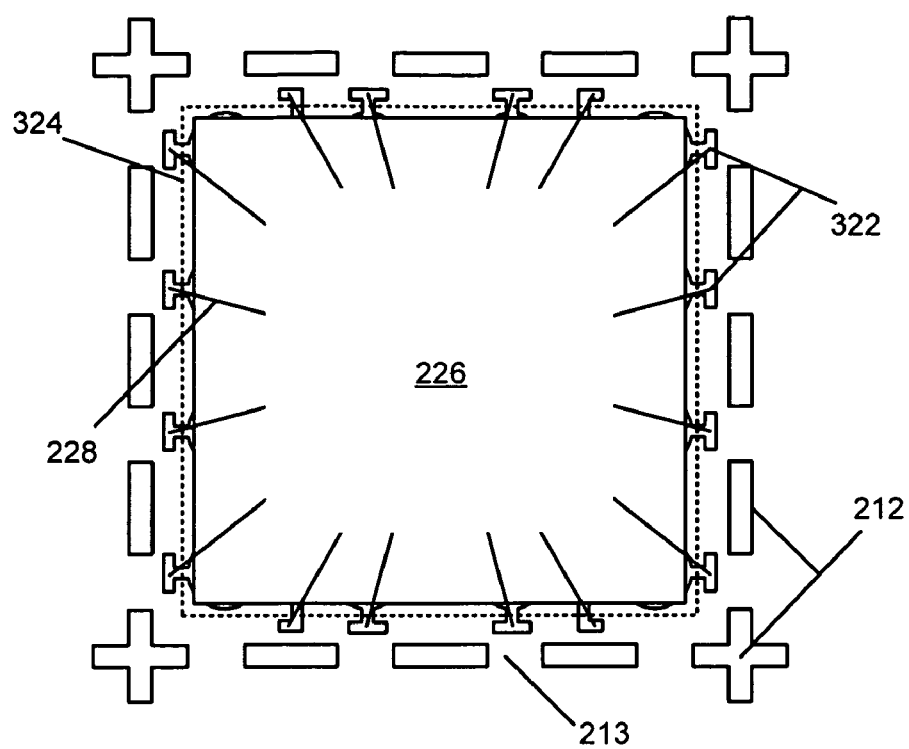
FIG. 3C illustrates a magnified view of one device area of FIG. 3A having a die mounted and electrically connected thereon in accordance with one embodiment of the present invention.
Figure 4:
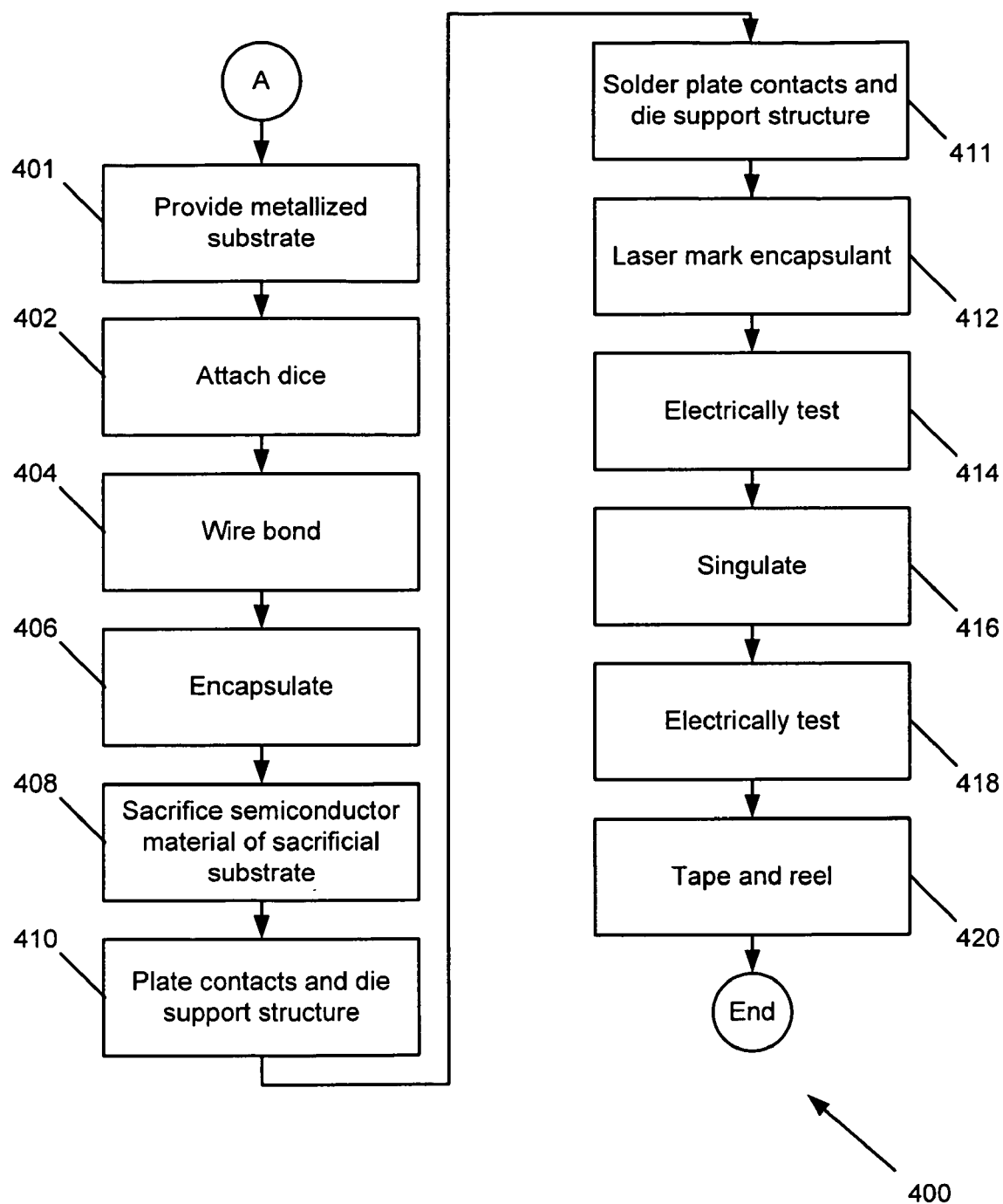
FIG. 4 shows a flowchart illustrating a process of packaging integrated circuits using a metallized sacrificial wafer substrate in accordance with one embodiment of the present invention.

Referring now to FIG. 4, and further in view of FIGS. 2L-2Q and 3B-3C, a process 400 for packaging integrated circuits using a metallized sacrificial wafer substrate according to one embodiment of the present invention will be described. In the described embodiment, the metallized substrate 300 is provided in step 401. A plurality of integrated circuit dice 226 are attached to the metallized substrate 300 in step 402 using any of a number of suitable die attach techniques. This is illustrated in FIGS. 2L and 3C, wherein each die 226 is mounted onto an associated die attach area 324. By way of example an adhesive paste or an adhesive tape can be used to secure the dice 226 to the die attach area 324. In the described embodiment, the die 226 is mounted directly over the inner row of contacts 210 and portions of the outer row of contacts within the die attach area 324 of the associated device area 302.

Figure 2M:
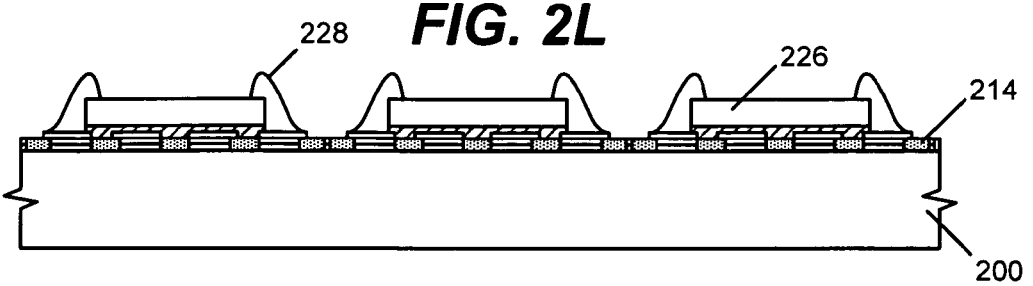

The dice 226 are then electrically connected to selected contacts 210 on their associated device areas 302 in step 404, as illustrated in FIGS. 2M and 3C. By way of example, in the described embodiment, I/O pads on the active surface of the dice 226 are electrically connected with corresponding bonding portions 322 of the contacts 210 with bonding wires 228 and associated wire bonds, although flip chip type mounting or any other suitable electrical connection technique may be used.

Figure 2N:
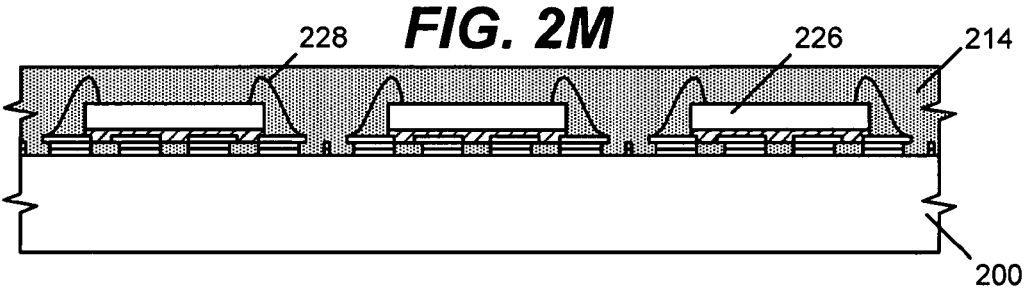

In step 406, the front surface of the metallized substrate 300 is then encapsulated with a molding material 214 such that the molding material covers the contacts 210, the bonding wires 228 and the dice 226, as best illustrated in FIG. 2N. A variety of known encapsulation techniques such as FAM, glob topping, screen printing, or stencil printing may be used to encapsulate the device areas. In various embodiments, the device areas 302 are encapsulated substantially simultaneously, such as with a FAM system. Generally, it is desirable for the encapsulant to cover all of the device areas so that when the semiconductor material of the metallized substrate 300 is later sacrificed, the encapsulant material will hold all of the devices together. However, this is not a requirement. By way of example, in some embodiments, each device area may be encapsulated individually or with a mold that includes a separate mold cavity for each device area. In these embodiments, a wafer mount tape or other support structure may be required to hold the device areas together when the substrate 300 is sacrificed.

Figure 2O:
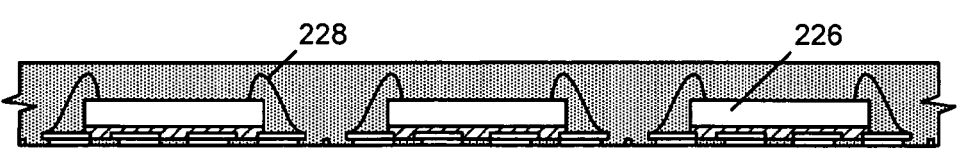
Figure 3D:
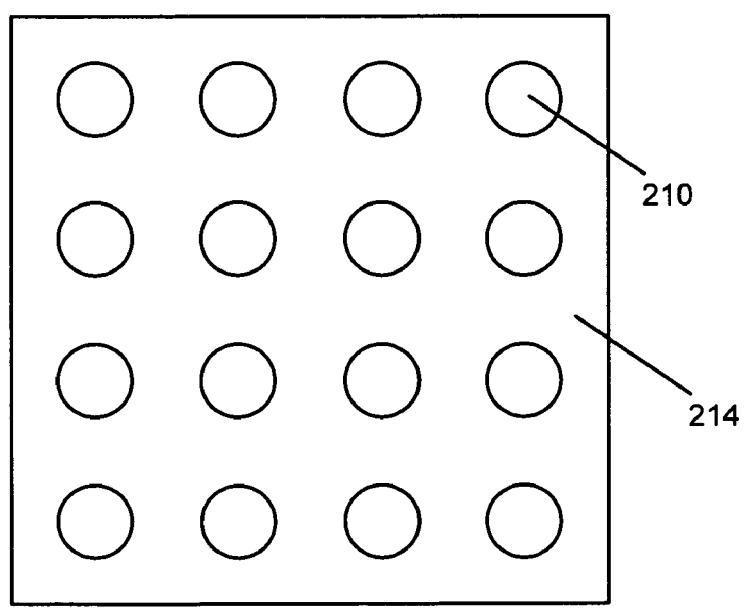
FIG. 3D illustrates the bottom surface of the device area of FIG. 3C after encapsulation with a molding material, sacrificing the sacrificial wafer substrate, and singulation.

The semiconductor material of the metallized sacrificial substrate 300 is then sacrificed in step 408 leaving the metallized contacts 210 exposed, as is illustrated in FIG. 2O and FIG. 3D (which illustrates a bottom view of a single device area 302 after removal of the sacrificial wafer). Removing the semiconductor material leaves the metallized contacts suitable for use as electrical connections to external devices such as printed circuit boards (PCBs). The semiconductor material may be sacrificed by any suitable means. In the preferred embodiment, the semiconductor material is subjected to a backgrind operation until the contacts 210 are exposed, and in various embodiments, until the titanium portions of the contacts are removed. In some embodiments, the backgrind operation may continue until a few microns of the contacts 210 themselves are ground away, thus providing more assurance that all of the contacts 210 are exposed.

Figure 2P:
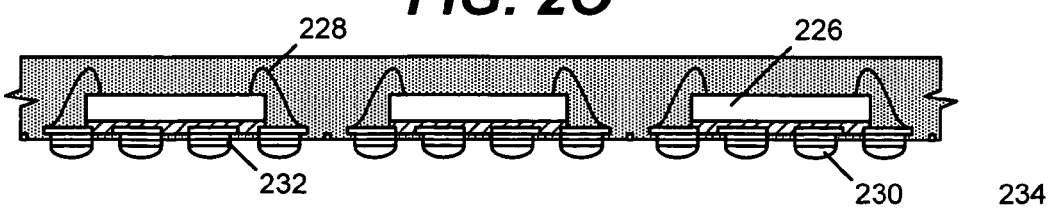
Figure 2Q:
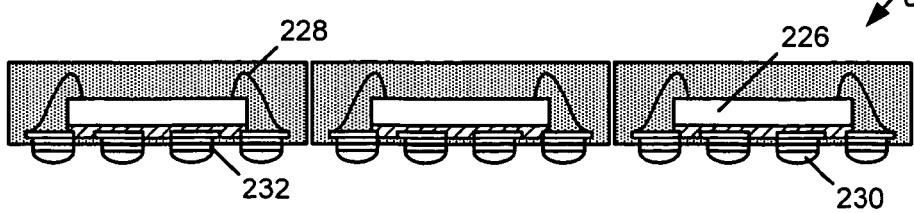

It may often be desirable to form solder bumps 230 on each of the contacts 210 (i.e., bump the devices) while still at this "panel" level. In the described embodiment, the contacts 210 are solder plated, although any suitable method may be used to solder coat the contacts 210. As mentioned above, the metallized contacts 210 are generally formed from a material such as copper that corrodes when exposed to ambient air and/or does not adhere well to certain solders. Therefore, as will be appreciated by those familiar with packaging in general, in some situations, it may also be desirable to plate the contacts 210 by applying one or more metallization layers 232 onto the contacts 210 prior to solder plating. By way of example, lead or lead-based alloys work well. This plating is carried out in step 410 and is illustrated in FIG. 2P. The plated contacts 210 may then be solder plated in step 411.

In many embodiments, the molding material 214 associated with each device area 302 may then be laser marked at the panel level in step 412. One particularly noticeable feature of the described panel is that after the semiconductor material of the metallized substrate 300 has been removed, the device areas are typically not electrically connected. Therefore, the device areas may also be tested in panel form, at step 414, which is advantageous from a cost standpoint. In step 416, the device areas 302 may then be singulated along the saw street structures 212 by sawing, laser cutting, plasma etching or other suitable means, thereby providing a plurality of singulated integrated circuit packages 234. It should be noted that the metallized saw streets 212 are typically substantially obliterated during device singulation. However, in contrast to conventional leadframes, the small thickness of the saw street structures 212 (approximately 10 to 20 microns), as compared to conventional leads (approximately 100 to 200 microns), allows for much improved saw blade life. After device singulation, the IC packages may then be electrically tested again in step 418. This second round of testing is advantageous as the process of singulation is potentially capable of breaking the electrical bonds. Subsequently, the singulated packages may be taped and reeled in step 420.

It should be appreciated that the small thickness of the contacts 210 and various other structures means less metal is required. Moreover, this means that the contacts 210 and various other structures, themselves, on the metallized substrate 300 won't necessarily be the constraint determining the resultant package thickness.

Although only a few embodiments of the invention have been described in detail, it should be appreciated that the invention may be implemented in many other forms without departing from the spirit or scope of the invention. By way of example, although specific IC packaging features have been described (such as contacts and tie bar structures), it should be appreciated that a wide variety of packaging structures can be created using the described wafer level approach. The described thin film deposition approach can be used to produce IC packaging features having virtually any desired footprint. Thus, the geometry of the contacts and other structures as well as the layout of such structures may be varied as appropriate for a particular application. Accordingly, the present embodiments are to be considered as illustrative and not restrictive and the invention is not to be limited to the details given herein, but may be modified within the scope of the appended claims.

The invention claimed is:

1. A method of constructing a panel suitable for use in the packaging of integrated circuit dice, comprising:
   providing a substrate formed from a sacrificial semiconductor wafer, the substrate having a first surface including a plurality of device areas;
   metallizing the first surface of the substrate to form an array of metallized electrically isolated contacts that are not electrically connected to any circuits within the wafer, each of the array of contacts having a first surface;
   encapsulating the first surface of the substrate and the array of contacts with molding material while leaving first surfaces of the contacts substantially exposed and uncovered by molding material;
   after the encapsulating, metallizing the substrate to form a plurality of traces over the molding material and the contacts, each of the plurality of traces including a trace portion and an associated bonding portion, the associated bonding portion not being positioned on the first surface of any of the contacts, the trace portion being formed on the first surface of an associated contact and extending over the molding material and beyond the associated contact to physically and electrically connect the first surface of the associated contact to the associated bonding portion.

2. A method as recited in claim 1, wherein the metallization of the first surface of the substrate also defines metallized saw street structures that are arranged in associated saw streets that define the plurality of device areas prior to encapsulating the first surface of the substrate.

3. A method as recited in claim 2, wherein ones of the metallized saw street structures have associated gaps between the ones of the saw street structures, the gaps being arranged such that each device area includes at least one associated saw street having at least one gap in the portion of the saw street adjacent the device area such that during encapsulation the gaps allow molding material to flow therethrough.

4. A method as recited in claim 3, wherein the encapsulating is performed in a mold cavity arranged such that molding material is substantially prevented from covering the first surfaces of the saw street structures.

5. A method as recited in claim 1, wherein at least one trace portion is arranged to extend between at least two other contacts.

6. A method as recited in claim 1, further comprising:
   attaching a plurality of dice to the substrate, wherein each die is mounted on an associated device area;
   electrically connecting the dice to selected traces on their associated device areas with electrical connections;
   encapsulating the dice, the traces and the electrical connections with molding material while leaving outer surfaces of the bonding portions exposed; and
   sacrificing the semiconductor material of the wafer after the encapsulation leaving at least portions of the contacts exposed to serve as electrical contacts for their associated dice.

7. A method as recited in claim 6, wherein the sacrificing of the wafer is performed by backgrinding the wafer until at least a portion of the contacts are exposed.

8. A method as recited in claim 7, wherein the backgrinding is performed until at least 1 micron of the contacts are ground away.

9. A method as recited in claim 6, wherein the encapsulation material holds the plurality of device areas together after the semiconductor material of the wafer has been sacrificed.

10. A method as recited in claim 6, further comprising solder plating the exposed contacts.

11. A method as recited in claim 6, further comprising singulating the device areas to form a multiplicity of integrated circuit die packages.

12. A method as recited in claim 11, further comprising electrically testing the device areas at the panel level prior to singulating the device areas.

13. A method as recited in claim 2, further comprising singulating the device areas along the saw streets.

14. A method as recited in claim 1, further comprising:
   depositing a first metal layer on the first surface of the substrate;
   depositing a first photoresist layer on the first metal layer;
   etching the first metal layer to form the array of contacts using photolithographic techniques;
   depositing a second metal layer on the first surface of the substrate;
   depositing a second photoresist layer on the second metal layer; and
   etching the second metal layer to form the plurality of traces using photolithographic techniques.

* * * * *